United States Patent [19]
Leong

[11] Patent Number: 6,082,695
[45] Date of Patent: Jul. 4, 2000

[54] MOUNTING APPARATUS

[75] Inventor: Ming Huat Leong, Los Gatos, Calif.

[73] Assignee: Compaq Computer Corporation, Cupertino, Calif.

[21] Appl. No.: 09/134,745

[22] Filed: Aug. 14, 1998

[51] Int. Cl.[7] .............................. H02B 1/01; H05K 1/14; H05K 5/00
[52] U.S. Cl. .................. 248/346.01; 361/829; 361/740; 361/757; 211/41.17
[58] Field of Search .......................... 248/694; 29/525.01; 361/829, 737, 740, 752, 757, 759, 801–802, 750–751, 726–728, 732, 736, 747–748, 825; 235/441, 486; 312/223.2; 40/765, 766, 611

[56] References Cited

U.S. PATENT DOCUMENTS

| | | | |
|---|---|---|---|
| 2,641,858 | 6/1953 | Burr | 40/766 |
| 3,542,365 | 11/1970 | Gantz | 40/765 |
| 3,668,476 | 6/1972 | Wrabel et al. | 361/757 |
| 3,783,543 | 1/1974 | Hemgren | 40/766 |
| 3,851,222 | 11/1974 | Michalak et al. | 361/740 |
| 4,452,359 | 6/1984 | Koppensteiner | 211/41 |
| 4,626,963 | 12/1986 | Speer | 361/424 |
| 5,124,888 | 6/1992 | Susuki et al. | 361/395 |
| 5,184,283 | 2/1993 | Hamel | 361/395 |
| 5,335,434 | 8/1994 | Shultz et al. | 40/766 |
| 5,375,040 | 12/1994 | Cooper et al. | 361/730 |
| 5,548,483 | 8/1996 | Feldman | 361/737 |
| 5,594,627 | 1/1997 | Le | 361/801 |
| 5,673,182 | 9/1997 | Garner | 361/829 |

*Primary Examiner*—Anita M. King
*Assistant Examiner*—Michael Nornberg
*Attorney, Agent, or Firm*—Fenwick & West LLP

[57] ABSTRACT

A mounting apparatus includes a bracket having plural sides adapted to accommodate a board between the sides. First fasteners on the plural sides of the bracket are disposed to connect the board to the bracket, wherein the fasteners are adapted to vertically restrain movement of the board relative to the bracket. At least one second fastener on one of the sides releasably secures the bracket to a mounting surface. A process for mounting a board on a surface includes the steps of fitting a board onto a bracket having plural sides, fastening the board to the bracket with first fasteners, and engaging a second fastener with a mounting surface. The board may be a printed wiring board or a printed wiring assembly. The plural sides may include left, right, back, and front sides. The sides may be perpendicular to each other. The first fasteners may be clips, screws, or channels found on the inside of the plural sides. A second fastener may also be included, and may be a slot, a clip, or a tab.

25 Claims, 3 Drawing Sheets

MOUNTING APPARATUS

FIELD OF THE INVENTION

This application relates to a mounting apparatus, and more particularly, to a mounting apparatus that allows quick and easy installation of a printed wiring board in a computer cabinet.

BACKGROUND OF THE INVENTION

A computer cabinet may enclose and hold parts of a computer system, including disk drives, power supplies, fans, central processing unit (CPU) boards, peripheral boards, and the cables used for connecting the parts together. Sometimes the cables, particularly the cables associated with the power supplies, are routed to other parts of the system by connecting them through a printed wiring board (PWB) or a printed wiring assembly (PWA) located at the bottom of the cabinet or other fixed non-removable part of the cabinet walls such as its side walls. CPU and peripheral boards typically are plugged into a backplane connector. The connector may be of the plug and socket type. However, as shown in FIG. 1, the above-mentioned boards may be mounted to the computer cabinet on standoffs and fastened with fastening hardware such as screws. The standoffs keep the bottom of the board from touching the bottom of the cabinet, thus preventing short circuits on the board. Typically at least four standoffs are used, one for each corner of the board. Often, additional standoffs are placed near the center of the board to provide additional support and prevent flexing of the board when connectors are plugged in and pulled out.

One problem with using fastening hardware such as screws to attach the parts to the computer cabinet is that the fastening hardware may be difficult to access during the manufacturing and servicing of the computer system. The fastening hardware is typically very small because computer cabinets are tightly packed so that the size of the system is small enough to fit on or under a desk. In addition, the parts contained in the computer are tightly packed so that the fastening hardware is difficult to reach without a significant amount of effort. When a technician replaces a part which is fastened to a computer cabinet with screws, he typically reaches into the computer cabinet with a screwdriver in order to remove the screws which attach the part to the computer cabinet. Even if the technician can access the screws easily enough to unscrew them, he may drop the screws into the computer system as he tries to remove the screws or as he tries to remove the part itself. If he loses the screw or forgets to remove it, the screw may cause a short circuit in one of the components of the system the next time the computer is powered up. As a result, replacing parts in the computer system is a time-consuming and frustrating process.

Another problem with fastening a board to a computer cabinet using screws is that excessive flexing of the board may occur as a result of forces applied toward the board and away from the board as connectors are plugged in and pulled out of the top of the board. The amount of flexing may be sufficient to cause failures when the board includes connectors which require high insertion and extraction forces, for example, power supply connectors. Attempts to solve this problem include adding standoffs to the center of the board to provide additional support. However, adding standoffs requires adding more screws, thus increasing the number of screws a technician needs to remove when replacing the board. Another disadvantage to this solution is that the additional screw holes required on the board reduce the area in which circuit traces may be routed because a portion of the board must be reserved for the holes. This reduces the amount of circuitry which may be placed on the board and also reduces the amount of flexibility the board designer has in determining where the circuit traces should be located.

Advantages of the invention will be set forth, in part, in the description that follows and in part, will be understood by those skilled in the art from the description or may be learned by practice of the invention. The advantages of the invention will be realized and attained by means of the elements and combinations particularly pointed out in the appended claims and equivalents.

SUMMARY OF THE INVENTION

The present invention is directed to a mounting apparatus that eliminates or substantially reduces the number of fasteners required to mount a board to a computer cabinet, thereby reducing the manufacturing cost and the servicing costs for installation, provides easy installation and removal in difficult access areas, and requires only a short travel movement for installation. A mounting apparatus of the present invention prevents the excessive flexing of a board which may occur when connectors requiring high insertion and extraction forces, such as power supply connectors, are plugged into and pulled out of the top of a board. By reducing the amount of flexing that may occur, the number of failures resulting from broken circuit traces decreases. The present invention also reduces the need for standoffs to support the board, thereby reducing the number of screws needed to mount the board. Reducing the number of screws required to mount the board has the advantage that a technician may replace the board faster than would be possible if the technician had to remove and replace multiple screws in order to replace the board. By reducing the number of screws on the board, the number of holes required to accommodate the screws is decreased, thereby increasing the total board area in which circuit traces may be routed. This increases the amount of circuitry which may be placed on the board and also increases the amount of flexibility the board designer has in determining where the circuit traces should be located.

The present invention is directed to a mounting apparatus that may include a bracket having a base and plural sides for accommodating a printed wiring board or similar device. At least one side of the bracket includes a slot or other mechanism for engaging a mounting surface after the board has been attached to the bracket. The mounting surface is typically the bottom or nonremovable wall of a computer cabinet. Channels, flanges or other suitable mechanisms are located on the bracket to capture the board edges in order to prevent excessive flexing of the board due to push and pull forces applied normal to the board surface from inserting and removing connectors from the board. There may be at least one fastener on at least one of the bracket sides for allowing quick and easy installation and removal of the board into and out of the bracket. The fastener secures the board to the bracket. The fastener may include a screw for securely fastening the board to the base of the bracket, or may include a bracket side which is removable from the board and bracket assembly.

The present invention is also directed to a process for mounting a board on a surface that includes the steps of fitting a board onto a bracket, fastening the board to the bracket, and engaging the bracket with a mounting surface.

BRIEF DESCRIPTION OF THE DRAWINGS

The accompanying drawings, which are incorporated in and constitute a part of this specification, illustrate several embodiments of the invention and, together with the description, serve to explain the principles of the invention.

DETAILED DESCRIPTION OF PREFERRED EMBODIMENTS

Reference will now be made in detail to preferred embodiments of the invention, examples of which are illustrated in the accompanying drawings. Wherever convenient, the same reference numbers will be used throughout the drawings to refer to the same or like parts.

Figure 1:
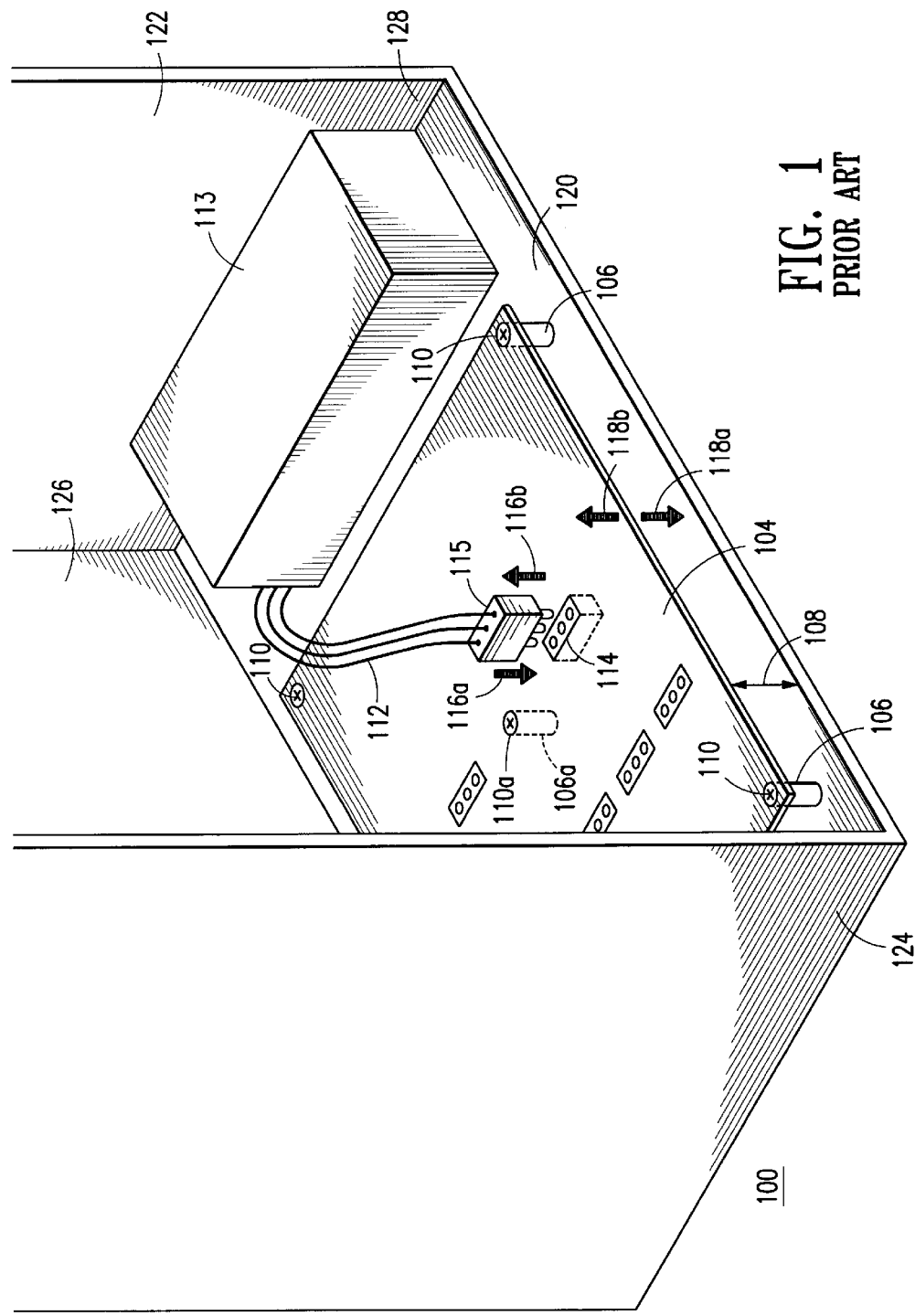
FIG. 1 is a perspective view of a prior art mounting apparatus.

FIG. 1 shows a perspective view of the prior art and includes a computer cabinet 100 having a bottom 120, sides 122 and 124, rear 126, top (not shown) and front panel (not shown). For purposes of clarity, not all parts of the computer are shown. Cabinet 100 contains a printed wiring board 104 which has been installed using the method of the prior art. Printed wiring board 104 is mounted on standoffs 106 located in each corner of board 104, forming a gap 108 between the underside of board 104 and bottom 120 of cabinet 100. Board 104 is held in place by screws 110 which go through holes in the corners of board 104 into standoffs 106 which are attached to bottom 120 of cabinet 100. One of the problems with this configuration is that when connector 115 is plugged into socket 114, the insertion forces may bend the board 104. Arrow 118a, shows how board 104 flexes when a connector is plugged in, and arrow 118b shows how board 104 flexes when a connector is removed. If the board flexes enough, failures may occur in the circuit traces of the board. Failures may also occur if board 104 is flexed enough for connections on the bottom of the board to reach the bottom of the cabinet 100, thereby causing a possible short circuit. To help prevent such problems, additional standoffs 106a may be added to the center of board 104 and held in place using screw 110a for additional support so that the center of board 104 does not flex as much when connector 115 is plugged into socket 114, and removed. Typically, a plurality of standoffs are used around connectors mounted near the center of the board to provide additional support. This approach, however, introduces the disadvantage that the amount of usable circuit trace area on the board is reduced by at least the amount of area required to accommodate each hole into which a screw 110a is inserted in order to attach the board 104 onto each of the multiple standoffs 106a. In addition to reducing the amount of area on the board 104 which can be used for circuit traces, the screw hole also reduces the amount of flexibility a design engineer has for laying out the circuit traces on the board 104 because the design engineer must route the circuit traces around the hole.

Computer components such as power cable 112 for device 113 are plugged into board 104 via socket 114. Device 113 may be a power supply, a peripheral device such as a disk drive, another printed wiring board, or any appropriate device which may require connection to board 104. Forces exerted by plugging cable 112 into board 104, shown by arrow 116a, and removing cable 112 from board 104, shown by arrow 116b, cause flexing of the board as shown by arrows 118a and 118b. This flexing may cause components to be shaken loose from the board or break off, or may crack or break copper traces on the board, resulting in failures. As previously mentioned, center standoff 106a (shown in shadow) may be added to provide additional support. However, this reduces the amount of area available on board 104 for routing circuit traces and for installing connectors 114 because a hole must be drilled into the center of board 104 in order to accommodate screw 110a which fastens board 104 onto standoff 106a and bottom 120 of computer cabinet 100.

Figure 2:
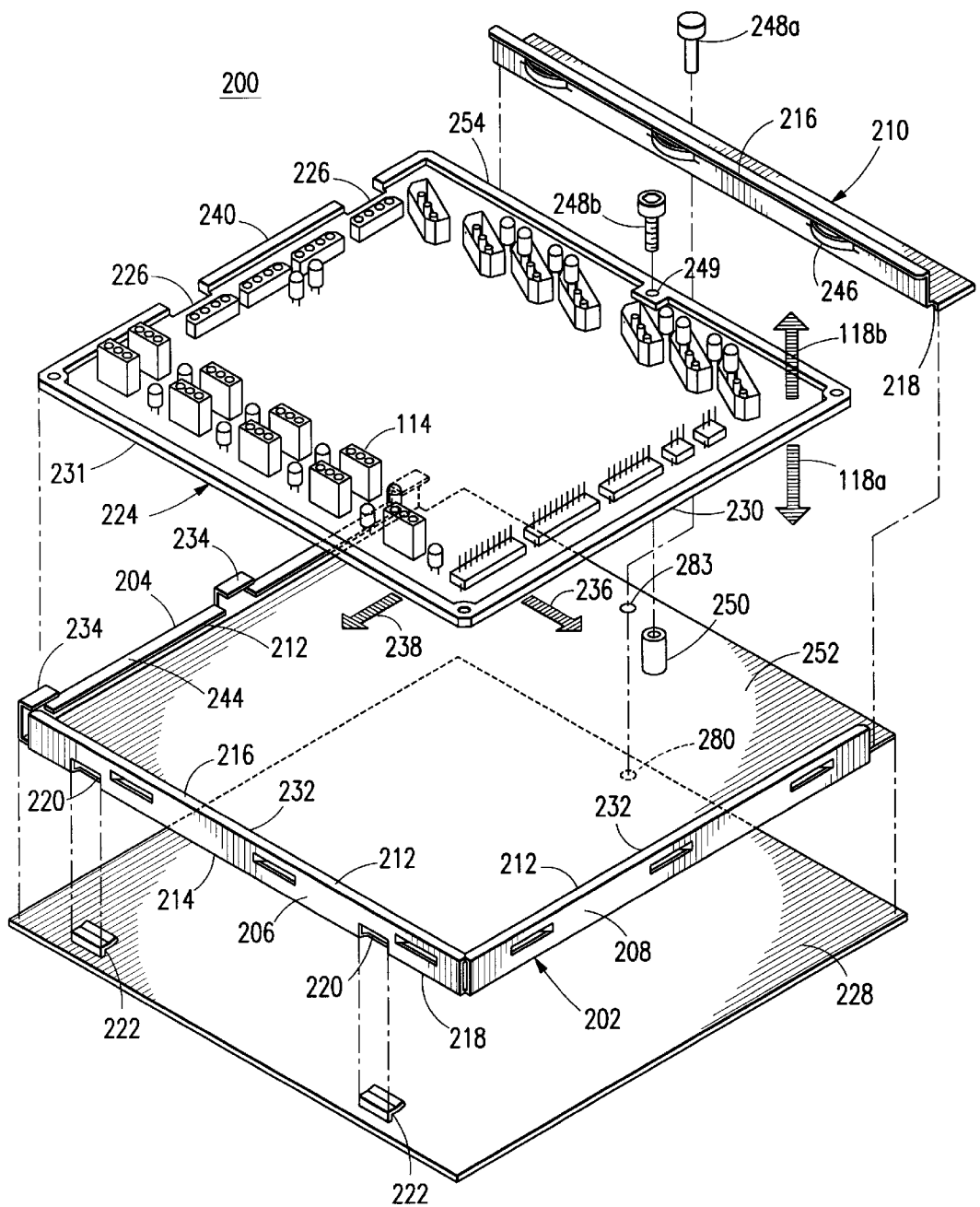
FIG. 2 is an exploded view of a mounting apparatus in accordance with a preferred embodiment of the present invention.

FIG. 2 shows a mounting apparatus in accordance with the preferred embodiment of the present invention. Mounting apparatus 200 includes a bracket 202 having at least three sides 204, 206 and 208 and a base 252. A fourth side 210 is optional. Each side 204, 206, 208 and 210 has an inner edge 212, outer edge 214, upper edge 216, and lower edge 218. Each bracket 202 has at least one aperture 220 on at least one of sides 204, 206, 208, and 210, which is used for engaging a tab 222 on a mounting surface 228. In a preferred embodiment of the present invention, mounting surface 228 is the bottom of a computer cabinet 100, where tabs 222 have been installed on bottom 120 near rear 126 of cabinet 100. In a preferred embodiment of the present invention, aperture 220 is a slot having angled edges, such that the aperture is wider toward the rear of bracket 202 than toward the inner edge 212 of side 206. The angled edges of the slot serve to self align the bracket 202 with the rectangular shaped tab 222 when the bracket is fully inserted. (An advantage of this feature will become apparent below.) Bracket 202 may have a plurality of apertures 220 for engaging a plurality of tabs 222. In a preferred embodiment of the present invention, slots 220 are located on one side 206 of bracket 202 so that mounting apparatus 200 may slide easily into a computer cabinet 100. Side 206 is inserted into computer cabinet 100 so that slots 220 engage with tabs 222 located on bottom 120 of computer cabinet 100. Mounting hole 283 is now aligned to threaded hole 280 in bottom 120 of the mounting surface 228 of the computer cabinet 100. Other schemes and mechanisms for mounting a bracket to a computer cabinet are, of course, within the scope of the present invention.

A circuit card 224 having a least one notch 226, slides into bracket 202 before bracket 202 is mounted on mounting surface 228. Circuit card 224 is typically a printed wiring board (PWB) or a printed wiring assembly (PWA), but may be any board or substantially flat object which is appropriately mounted inside a computer enclosure 100. A PWB is a board that has circuit traces on it, and a PWA is a PWB onto which the components have been installed. Board 224 is mounted onto bracket 202 by sliding board edge 230 into channel 232 of side 208. Channel 232 provides support for the board and may be formed by a plurality of protrusions on the inside of bracket 202, as shown in FIG. 2, and may also be a shelf or flange running along the inside edge of bracket 202. In a preferred embodiment of the present invention, channel 232 runs substantially parallel to edge 230 of board 224. This provides support for the board along the board's edge thereby reducing the amount of flexing of the board when pressure is applied to edges of the board.

Mounting board 224 onto bracket 202 requires lining up notches 226 with clips 234 so that board 224 lies substantially flat. Board 224 is inserted into channel 232 of bracket 202 in the direction of arrow 236 so that edge 230 makes contact with channel 232 of side 208 of bracket 202. Board 224 is then slid in a substantially perpendicular direction, as shown by arrow 238, so that edge 231 of board 224 engages channel 232 located on side 206 of bracket 202. As board 224 engages channel 232 on side 206, edge 240 of board 224 engages with clips 234 (upon sliding board in direction of arrow 238), holding board 224 in place on three sides of bracket 202. One or more clips 234 may be used depending on the degree of support desired for the board. The number of clips 234 required depends on factors such as the number of connectors mounted on that side of the board 224 and the degree of board flexing allowed. The reason for using a clip 234 on that side of the board is to minimize the amount of insertion travel for the board and to provide for quick and easy installation of the board into the channel. Clip 234 may be integral to bracket 202 or may be a separate piece attached to upper edge 216 of bracket 202. Clip 234 may be made from any appropriate material and disposed in any appropriate manner that will hold board 224 and keep it sufficiently in place when perpendicular forces are applied, as shown by arrows 118a,b. Screws or similar fasteners may also be used to securely mount board 224 to bracket 202.

An optional fourth side 210 may be added to bracket 202 to provide additional support. Fourth side 210 includes channel 246 which engages edge 254 of board 224 and base 252 of bracket 202. A fastener 248a holds bracket side 210 in place by attaching bracket side 210 to base 252 and ultimately to the computer cabinet 228. In a preferred embodiment of the present invention, fastener 248a is a single locking fastener, but it could also be a screw. Optional mounting standoff 250 may be used for additional support for board 224 when three edge capture is desired and fourth side 210 is not used. In this case, screw 248b secures board 224 to base 252 at standoff 250, as shown. It should be noted that, when the previously described self-aligning feature having slant-walled apertures 220, is utilized, the hole 283 will automatically align with the appropriate hole in the cabinet so that fastener 248a may easily secure the mounting apparatus assembly to the computer cabinet.

Figure 3A:
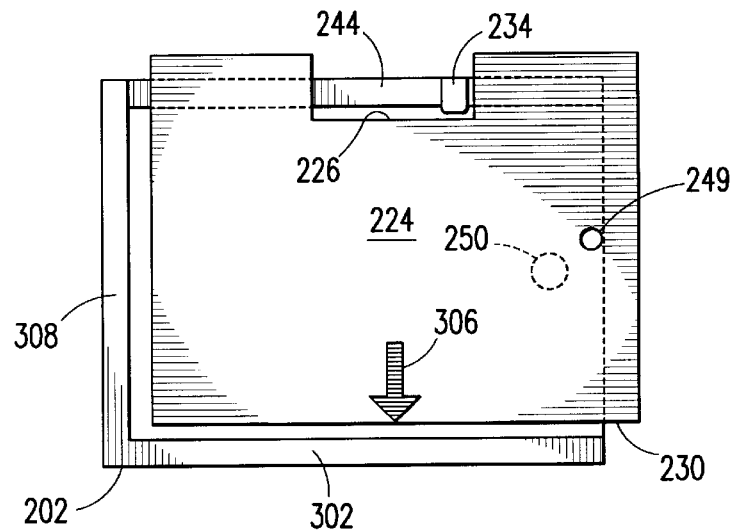
FIGS. 3a–c are top views of a preferred embodiment of the present invention, which collectively illustrate steps involved in the process of mounting a board in accordance with a preferred method of the present invention.
Figure 3B:
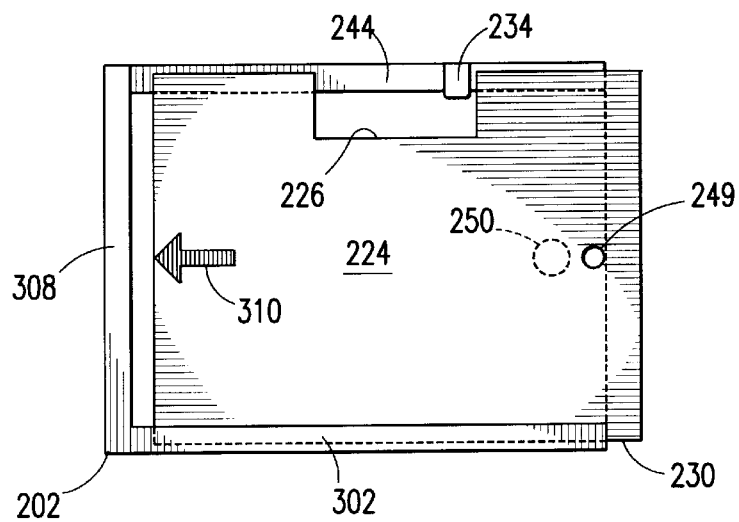
Figure 3C:
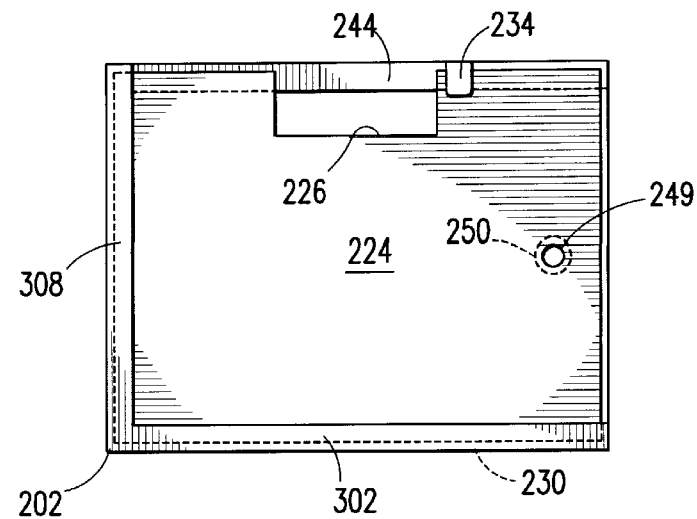

FIG. 3 shows a top view of a mounting apparatus in accordance with the preferred embodiment of the present invention, showing how a board engages with bracket 202. In FIG. 3a, a user places board 224 onto bracket 202 so that clip 234 is visible from notch 226. In this position, standoff 250 and hole 249 for fastener 248 are not yet aligned. The user then slides board 224 in a direction shown by arrow 306 so that edge 230 of board 224 engages with channel 302. Channel 302 may be a protrusion or a flange located on bracket 202 for supporting board 224 to hold against vertical and horizontal motion along arrow 306. After the user slides board 224 in the direction of arrow 306, the board is in the position shown in FIG. 3b, in which one edge of board 224 is secured in channel 302 of bracket 202. In order to secure the remaining edges of board 224, the user slides board 224 in a direction shown by arrow 310, so that board 224 engages channel 308 and clip 234. In this position, clip 234 engages the unnotched portion of board 224. Also, standoff 250 lines up with hole 249 so that a fastener 248b may be inserted into hole 249. Fastener 248b, for example a screw, is inserted through hole 249 in board 224 and into standoff 250. Tightening fastener 248b secures board 224 to bracket surface 252. Bracket 202 and board 224 then may be mounted onto mounting surface 228 by inserting tabs 222 into slots 220, and securing screw 248a to the computer mounting surface 228. (See FIG. 2.) Thus, with the device of the present invention, the installation of a printed circuit board into computer cabinet 100 is quick, easy and efficient.

Other embodiments will be apparent to those skilled in the art from consideration of the specification and practice of the invention disclosed herein. It is intended that the specification and examples be considered as exemplary only, with a true scope of the invention being indicated by the following claims and equivalents.

What is claimed is:

1. A mounting apparatus, comprising:

a bracket having plural sides accommodating a board therebetween, the plural sides including a first bracket side, a second bracket side, and a third bracket side disposed opposite to the first bracket side;

the board including a first board edge, a second board edge, and a third board edge disposed opposite the first board edge, the third board edge including a notched portion and an unnotched portion; and first fasteners on the plural sides of the bracket disposed to connect the board to the bracket, the first fasteners including a first channel formed in an inner edge of the first bracket side, a second channel formed in an inner edge of the second bracket side, and a clip disposed adjacent to an upper edge of the third bracket side, the clip being received by the notched portion on the third board edge when the first board edge is initially received by the first channel in the first bracket side, the clip being disposed against the unnotched portion of the third board edge when the second board edge is received by the second channel in the second bracket side;

wherein the first fasteners are adapted to vertically restrain movement of the board relative to the bracket.

2. The mounting apparatus of claim 1, further comprising:

at least one second fastener on one of the plural sides for releasably securing the bracket to a mounting surface, and wherein the board includes conductive traces.

3. The mounting apparatus of claim 1, wherein the first fasteners include a screw.

4. The mounting apparatus of claim 1, wherein all sides are perpendicular to at least one other of the sides.

5. The mounting apparatus of claim 1 wherein the board is one of a printed wiring card, a printed wiring board, a printed wiring assembly, and circuit card.

6. The mounting apparatus of claim 1 wherein at least one of the first channel and the second channel comprises a protrusion formed on one of the plural sides of the bracket.

7. The mounting apparatus of claim 1 wherein the first board edge is initially received by the first channel by sliding the board in a first direction, and wherein the second board edge is received by the second channel and the clip is disposed against the unnotched portion by sliding the board in a second direction.

8. The mounting apparatus of claim 2 wherein the mounting surface is a computer cabinet.

9. The mounting apparatus of claim 2, wherein the second fastener include a clip.

10. The mounting apparatus of claim 2, wherein the second fastener include a tab.

11. The mounting apparatus of claim 2, wherein the second fastener include a slot, and wherein the board includes conductive traces.

12. The mounting apparatus of claim 8, wherein the slot has angled edges for aligning the bracket when engaging a tab with the slot.

13. A mounting apparatus, comprising:

a bracket including a first bracket side, a second bracket side, and a third bracket side disposed opposite to the first bracket side, the bracket supporting a board including conductive traces for transmitting signals along the board;

the board including a first board edge, a second board edge, and a third board edge disposed opposite the first board edge, the third board edge including a notched portion and an unnotched portion; and a plurality of fasteners including a first channel formed in an inner edge of the first bracket side, a second channel formed in an inner edge of the second bracket side, and a clip disposed above an upper edge of the third bracket side, the clip being received by the notched portion on the third board edge when the first board edge is initially received by the first channel, the clip being disposed against the unnotched portion of the third board edge when the second board edge is received by the second channel, wherein the plurality of fasteners restrain vertical movement of the board relative to the bracket.

14. The mounting apparatus of claim 13 wherein the first channel comprises a protrusion formed on the first bracket side; and wherein the second channel comprises a protrusion formed on the second bracket side.

15. The mounting apparatus of claim 13, further comprising:

a surface fastener disposed on one of the bracket sides and adapted to removably secure the bracket to a mounting surface.

16. The mounting apparatus of claim 13 wherein the board is adapted to support electronic components.

17. The mounting apparatus of claim 16 wherein the electronic components are disposed adjacent to at least one of the board edges.

18. The mounting apparatus of claim 13 wherein the clip restrains the upward movement of the board relative to the bracket.

19. The mounting apparatus of claim 13 wherein the first board edge is initially received by the first channel by sliding the board in a first direction, and wherein the second board edge is received by the second channel and the clip is disposed against the unnotched portion by sliding the board in a second direction.

20. A mounting apparatus, comprising:

a bracket including a first bracket side, a second bracket side, and a third bracket side, the bracket supporting a board;

the board including a first board edge, a second board edge, and a third board edge, the third board edge including a notched portion and an unnotched portion; and a plurality of fasteners including a first channel formed in an inner edge of the first bracket side, a second channel formed in an inner edge of the second bracket side, and a clip disposed above an upper edge of the third bracket side, the clip being received by the notched portion on the third board edge when the first board edge is initially received by the first channel, the clip being disposed against the unnotched portion of the third board edge when the second board edge is received by the second channel, wherein the clip restrains the upward movement of the board relative to the bracket and at least one of the first channel and second channel restrains the downward movement of the board relative to the bracket.

21. The mounting apparatus of claim 20 wherein the first channel comprises a protrusion formed on the first bracket side; and wherein the second channel comprises a protrusion formed on the second bracket side.

22. The mounting apparatus of claim 20, further comprising:

a surface fastener disposed on one of the bracket sides and adapted to removably secure the bracket to a mounting surface.

23. The mounting apparatus of claim 20 wherein the board is adapted to support electronic components.

24. The mounting apparatus of claim 23 wherein the electronic components are disposed adjacent to at least one of the board edges.

25. The mounting apparatus of claim 20 wherein the first board edge is initially received by the first channel by sliding the board in a first direction, and wherein the second board edge is received by the second channel and the clip is disposed against the unnotched portion by sliding the board in a second direction.

* * * * *